(12) United States Patent
Zhao et al.

(10) Patent No.: US 11,127,930 B2
(45) Date of Patent: Sep. 21, 2021

(54) SUBSTRATE AND DISPLAY PANEL

(71) Applicant: Wuhan China Star Optoelectronics Semiconductor Display Technology Co., Ltd., Wuhan (CN)

(72) Inventors: Zhenyu Zhao, Wuhan (CN); Wei Li, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 156 days.

(21) Appl. No.: 16/490,904

(22) PCT Filed: Mar. 25, 2019

(86) PCT No.: PCT/CN2019/079410
§ 371 (c)(1),
(2) Date: Sep. 4, 2019

(87) PCT Pub. No.: WO2020/124840
PCT Pub. Date: Jun. 25, 2020

(65) Prior Publication Data
US 2020/0194710 A1 Jun. 18, 2020

(30) Foreign Application Priority Data
Dec. 18, 2018 (CN) .......................... 201811550380.0

(51) Int. Cl.
*H01L 51/52* (2006.01)
*G02F 1/1333* (2006.01)
*H01L 51/00* (2006.01)

(52) U.S. Cl.
CPC ...... *H01L 51/529* (2013.01); *G02F 1/133385* (2013.01); *H01L 51/0096* (2013.01); *H01L 51/5253* (2013.01); *G02F 2201/503* (2013.01); *H01L 51/0097* (2013.01); *Y10T 428/24997* (2015.04)

(58) Field of Classification Search
None
See application file for complete search history.

(56) References Cited

U.S. PATENT DOCUMENTS

| 2005/0173701 | A1* | 8/2005 | Kawase ............ H01L 51/0022 257/40 |
|---|---|---|---|
| 2012/0225505 | A1 | 9/2012 | Neff et al. |
| 2013/0105977 | A1 | 5/2013 | Hosseini et al. |
| 2015/0077941 | A1 | 3/2015 | Hosseini et al. |
| 2016/0225718 | A1 | 8/2016 | Mischitz et al. |

(Continued)

FOREIGN PATENT DOCUMENTS

| CN | 102341924 | 2/2012 |
|---|---|---|
| CN | 103094231 | 5/2013 |
| CN | 204144262 | 2/2015 |

(Continued)

*Primary Examiner* — Chinessa T. Golden

(57) ABSTRACT

A substrate and a display panel are provided. The display panel adopts an emerging porous metal material, and utilizes excellent characteristics of the material as a composite functional layer of the panel, so that it can simultaneously assume functions of protection, cushioning, and heat dissipation, and achieve a purpose of simplifying a structure of a display device and reducing the thickness of components.

7 Claims, 2 Drawing Sheets

(56) References Cited

U.S. PATENT DOCUMENTS

2019/0334124 A1   10/2019   Peng

FOREIGN PATENT DOCUMENTS

| CN | 104465557 | 3/2015 |
| CN | 205303466 | 6/2016 |
| CN | 105845662 | 8/2016 |
| CN | 108428805 | 8/2018 |

* cited by examiner

SUBSTRATE AND DISPLAY PANEL

RELATED APPLICATIONS

This application is a National Phase of PCT Patent Application No. PCT/CN2019/079410 having International filing date of Mar. 25, 2019, which claims the benefit of priority of Chinese Patent Application No. 201811550380.0 filed on Dec. 18, 2018. The contents of the above applications are all incorporated by reference as if fully set forth herein in their entirety.

FIELD AND BACKGROUND OF THE INVENTION

The present invention relates to a field of display technology, and more particularly, to a substrate and a display panel.

In recent years, as the demand for display levels has continuously increased, the manufacturing technology of display panels continues to innovate. Currently, a film layer of polyethylene terephthalate (PET), foam, graphene, or copper foil is often attached to the back of the display panel for protection, cushioning, and heat dissipation requirements.

Technical Problem

Because characteristics of these conventional materials are limited, it is difficult to implement different requirements in a same functional layer, thus a device structure of the display panel is complicated, and it is difficult to achieve thinness and lightness.

Therefore, how to improve the current display panel to make the device structure of the display panel simple and easy to realize thinness and lightness based on functions of protection, cushioning, and heat dissipation is a problem urgently needed to be solved in the development of display panels.

SUMMARY OF THE INVENTION

It is an object of the present invention to provide a display panel. The display panel adopts an emerging porous metal material, and utilizes the excellent characteristics of the material as a composite functional layer of the panel, so that it can simultaneously assume the functions of protection, cushioning, and heat dissipation, and achieve the purpose of simplifying the structure of the display device and reducing the thickness of the components.

According to an aspect of the present invention, the present invention provides a substrate including a base layer and at least one porous metal layer disposed on a surface of the base layer; wherein a material of the porous metal layer is a combination of one or more selected from a group consisting of copper, aluminum, iron, nickel, zinc-copper alloy, nickel-copper alloy, nickel-chromium-tungsten alloy, and nickel-iron alloy; the porous metal layer includes a plurality of pores having directional or random properties; the porous metal layer is produced by a liquid phase method, a solid phase method or a metal deposition method.

According to another aspect of the present invention, the present invention provides a substrate including a base layer and at least one porous metal layer disposed on a surface of the base layer.

According to an embodiment of the present invention, a material of the porous metal layer is a combination of one or more selected from a group consisting of copper, aluminum, iron, nickel, zinc-copper alloy, nickel-copper alloy, nickel-chromium-tungsten alloy, and nickel-iron alloy.

According to an embodiment of the present invention, the porous metal layer includes a plurality of pores having directional or random properties.

According to an embodiment of the present invention, the porous metal layer is produced by a liquid phase method, a solid phase method or a metal deposition method.

According to another aspect of the present invention, the present invention provides a display panel, the display panel including the aforementioned substrate and a pixel array disposed on the substrate.

According to an embodiment of the present invention, a material of the porous metal layer is a combination of one or more selected from a group consisting of copper, aluminum, iron, nickel, zinc-copper alloy, nickel-copper alloy, nickel-chromium-tungsten alloy, and nickel-iron alloy.

According to an embodiment of the present invention, the porous metal layer includes a plurality of pores having directional or random properties.

According to an embodiment of the present invention, the porous metal layer is produced by a liquid phase method, a solid phase method or a metal deposition method.

According to another aspect of the present invention, a display device including the aforementioned display panel is provided.

According to another aspect of the present invention, a method of manufacturing a substrate is provided, the method including the steps of: (a) providing a base layer; and (b) forming at least one porous metal layer on a surface of the base layer.

According to an embodiment of the present invention, in the step (b), a porous metal layer is produced by one of a liquid phase method, a solid phase method, and a metal deposition method.

According to an embodiment of the present invention, in the step (b), a material of the porous metal layer is a combination of one or more selected from a group consisting of copper, aluminum, iron, nickel, zinc-copper alloy, nickel-copper alloy, nickel-chromium-tungsten alloy, and nickel-iron alloy.

Beneficial Effect

The invention has the advantages that the display panel can simultaneously assume the functions of protection, cushioning, and heat dissipation by adopting the emerging porous metal material, thereby simplifying the structure of the display device, reducing the overall thickness of the display device, and making the display panel simpler and thinner.

BRIEF DESCRIPTION OF THE SEVERAL VIEWS OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DESCRIPTION OF SPECIFIC EMBODIMENTS OF THE INVENTION

Figure 1:
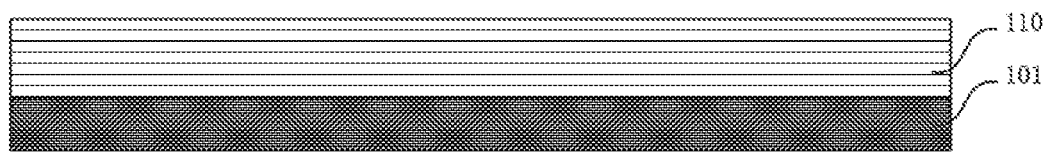
FIG. 1 is a schematic structural diagram of a substrate according to an embodiment of the present invention.

The following content combines with the drawings and the embodiment for describing the present invention in detail. It is obvious that the following embodiments are only some embodiments of the present invention. For the skilled persons of ordinary skill in the art without creative effort, the other embodiments obtained thereby are still covered by the present invention.

It should be noted that in the present disclosure the terms, such as, first, second, third are only for distinguishing an entity or operation from another entity or operation, and does not imply any specific relation or order between the entities or operations. Also, the terms "comprise", "include", and other similar variations, do not exclude the inclusion of other non-listed elements. Without further restrictions, the expression "comprises a . . . " does not exclude other identical elements from presence besides the listed elements.

The drawings, which are discussed below, and the various embodiments used to describe the principles of the present invention are intended to be illustrative only and not to limit the scope of the disclosure. Those skilled in the art will appreciate that the principles of the present invention may be implemented in any suitably arranged system. Exemplary embodiments will be described in detail, examples of which are illustrated in the accompanying drawings. Further, a terminal according to an exemplary embodiment will be described in detail with reference to the accompanying drawings. The same reference numerals in the drawings denote the same elements.

The terms used in the description of the present invention are intended to describe the specific embodiments and are not intended to illustrate the concept of the invention. Expressions used in the singular encompasses the plural forms of expression unless the context clearly dictates otherwise. In the description of the present invention, it is to be understood that the terms such as "comprising", "including", and "having" are intended to illustrate the possibility of having the features, numbers, steps, actions, or combinations thereof disclosed in the description of the present invention. It is not intended to exclude the possibility that one or more other features, numbers, steps, acts or combinations may be added. The same reference numerals in the drawings denote the same parts.

Embodiments of the present invention provide a substrate, a display panel, a manufacturing method thereof, and a display device. The details will be described separately below.

Referring to FIG. 1, the preset invention provides a substrate. The substrate includes a base layer 110 and at least one porous metal layer 101 disposed on a surface of the base layer 110. A material of the porous metal layer 101 is a combination of one or more selected from a group consisting of copper, aluminum, iron, nickel, zinc-copper alloy, nickel-copper alloy, nickel-chromium-tungsten alloy, and nickel-iron alloy. The porous metal layer 101 is produced by a liquid phase method, a solid phase method or a metal deposition method. The porous metal layer 101 includes a plurality of pores having directional or random properties.

Because the porous metal layer 101 is made of materials such as foamed copper, foamed aluminum alloy, nickel-chromium-tungsten alloy, and nickel-iron alloy, and the metal layer formed by mixing these materials is internally distributed with a large number of directional or random pores, so that good protection and cushioning effects can be achieved. Moreover, an energy absorption capacity of the formed porous metal layer 101 can reach 490 KJ/m3 to 3430 KJ/m3, which can play a good role in the display panel protection. The formed porous metal layer 101 also has good electromagnetic wave absorption characteristics and can function as electromagnetic protection. The porous metal layer 101 is formed as a heat dissipation material, the heat dissipation capacity can reach 30~40 W/(m·K). In addition, the formed porous metal layer 101 also has the characteristics of small proportion, strong energy absorption, good performance of restrain vibration, a large ratio of a surface area, and so on. In view of the excellent performance of the porous metal layer 101, it is therefore possible to combine a plurality of functional layers that respectively protect, buffer, dissipate, etc., to achieve multi-layered functionality of a layer of material. Therefore, the porous metal layer 101 can be applied to the display panel, thereby effectively reducing the thickness of the component and simplifying the process flow of the original display panel.

According to another aspect of the present invention, the present invention provides a display panel. The display panel includes the aforementioned substrate, and a pixel array disposed on the substrate. The display panel can be an organic light-emitting diode (OLED) panel or a liquid crystal display (LCD) panel. When the display panel is an OLED panel, the pixel array includes a thin film transistor layer and an electroluminescent layer disposed in a stacked manner. When the display panel is an LCD panel, the pixel array includes a thin film transistor layer and a color film layer which are stacked, and a liquid crystal disposed between the thin film transistor layer and the color film layer.

The display panel of the present invention is taken an OLED panel as an example to be described below, and compared with an existing OLED panel.

Figure 2:
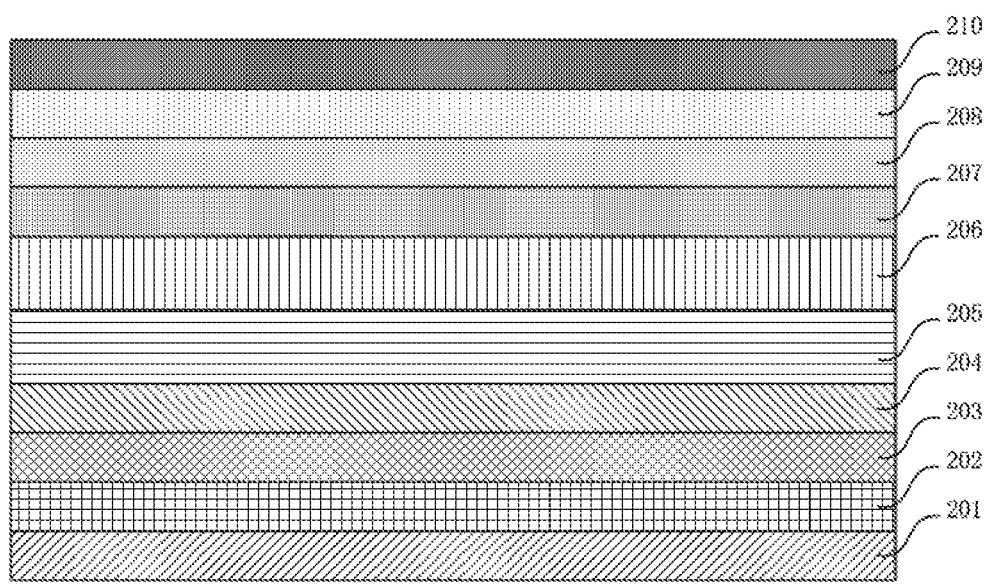
FIG. 2 is a schematic structural diagram of a conventional organic light-emitting diode (OLED) panel.

Referring to FIG. 2, an original OLED panel includes a flexible substrate 205, a thin film transistor layer 206 (prepared by a low temperature polysilicon process), an electroluminescent layer 207, a touch screen 208, a polarizer 209, and a cover plate 210. And a polyethylene terephthalate (PET) layer 204, a foamed layer 203, a copper foil layer 202, and a graphite layer 201 are disposed on the back of the OLED panel to achieve the functions of protection, cushioning, and heat dissipation. But this will increase the thickness of the OLED panel, hindering development of the display devices to be thinner and lighter.

Figure 3:
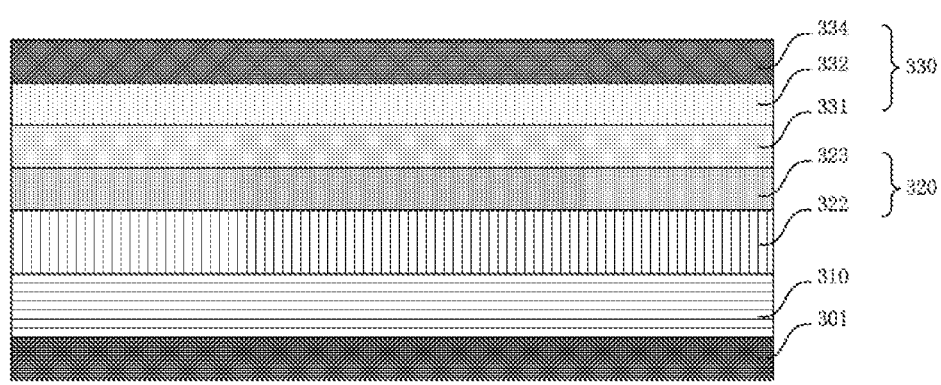
FIG. 3 is a schematic structural diagram of an OLED panel according to an embodiment of the present invention.

Referring to FIG. 3, the present invention provides an OLED panel 300.

In an embodiment, the OLED panel 300 includes a substrate including the above porous metal layer 301 and a base layer (not shown), and a pixel array 320 disposed on the substrate. The pixel array 320 includes a thin film transistor layer 322 and an electroluminescent layer 323 which are stacked.

In this embodiment, the substrate further includes a polyimide (PI) film layer (not shown) disposed on the base layer, and the PI film layer is made of a polyimide material. Because the polyimide material has the advantages of a wide temperature range, chemical resistance, high strength, and the like, the flexible substrate 310 formed by the PI film layer and the base layer has good flexibility. Of course, in other implementations of the present invention, the flexible substrate 310 can also be made of a combination of one or more materials selected from polyetherimide (PEI), polyphenylene sulfide (PPS), and polyarylate (PAR).

The pixel array 320 is disposed on the substrate 310. The pixel array 320 includes a thin film transistor layer 322 and an electroluminescent layer 323 which are sequentially stacked. The thin film transistor layer 322 is fabricated by using a low temperature polysilicon (LTPS) process. Of course, in other partial embodiments, the thin film transistor layer 322 can also be fabricated by an indium gallium zinc oxide (IGZO) process.

Optionally, the pixel array 320 can further include a thin film encapsulation layer (not shown) disposed on the electroluminescent layer 323. The thin film encapsulation layer is used to block a moisture attack.

In addition, the OLED panel 300 further includes a touch module 330 including a touch layer 331 and a cover plate glass 333. The touch layer 331 is used to implement a touch-control function. Preferably, the touch layer 331 uses an electronic ink film. The cover plate glass 333 is used to protect the touch module 330 and the pixel array 320.

In addition, the OLED panel 300 further includes a polarizer 332. The polarizer 332 is disposed between the touch layer 331 and the cover plate glass 333 in the touch module 330. The polarizer 332 is used to reduce the effects of reflection caused by external incident light. In other embodiments, the polarizer 332 can also be disposed on the electroluminescent layer 323. Alternatively, the polarizer 332 and the touch layer 331 are formed as one layer.

The back of the flexible substrate 310 is a porous metal layer 301. The porous metal layer 301 is made of a porous metal material.

The porous metal material cab be materials such as foamed copper, foamed aluminum alloy, nickel-chromium-tungsten alloy, and nickel-iron alloy. These materials are mixed to form a large number of directional or random pores inside the metal layer, which can provide good protection and cushioning. Moreover, the energy absorption capacity of the formed porous metal layer can reach 490 KJ/m3 to 3430 KJ/m3, which can play a good role in the display panel protection. The formed porous metal layer also has good electromagnetic wave absorption characteristics and can function as electromagnetic protection. The porous metal layer is formed as a heat dissipation material, the heat dissipation capacity can reach 30~40 W/(m·K). The thermal conductivity of the graphite layer and the copper foil layer used in the original OLED panel has reached 100 W/(m·K) and 370 W/(m·K). However, the thermal conductivity of the PET material directly contacting the heat source OLED panel is only 0.2 W/(m·K), and because of the contact thermal resistance, the thermal conductivity is actually not as good as that of the present invention using only one layer of porous metal layer.

In addition, the formed porous metal layer also has the characteristics of a small proportion, strong energy absorption, good performance of restrain vibration, a large ratio of a surface area, and so on. In view of the excellent performance of the porous metal layer, it is therefore possible to combine a plurality of functional layers that respectively protect, buffer, dissipate, etc., to achieve multi-layered functionality of a layer of material. Therefore, the porous metal layer can be applied to the different display panel, thereby effectively reducing the thickness of the component and simplifying the process flow of the original display panel.

In this embodiment, the porous metal layer is produced by a liquid phase method, a solid phase method or a metal deposition method.

Figure 4:
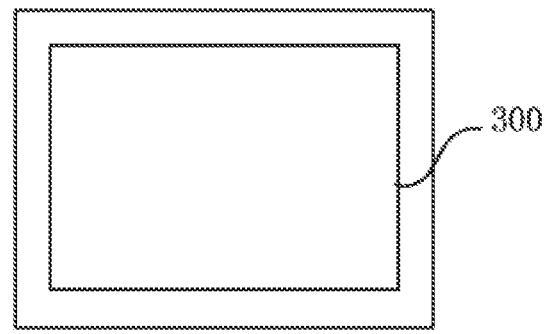
FIG. 4 is a schematic structural diagram of a display device according to an embodiment of the present invention.

Referring to FIG. 4, the present invention further provides a display device 400 including the above-described OLED panel 300 or LCD panel (not shown). The specific structure of the OLED panel will not be described in detail herein. Besides, because the basic structure of the LCD panel is well known to those skilled in the art, it will not be described herein. In addition, the display device can be, but not limited to, an e-book, a smart phone, a digital television, a tablet computer, a palmtop computer, a notebook computer, a mobile internet device, or a wearable device.

Figure 5:
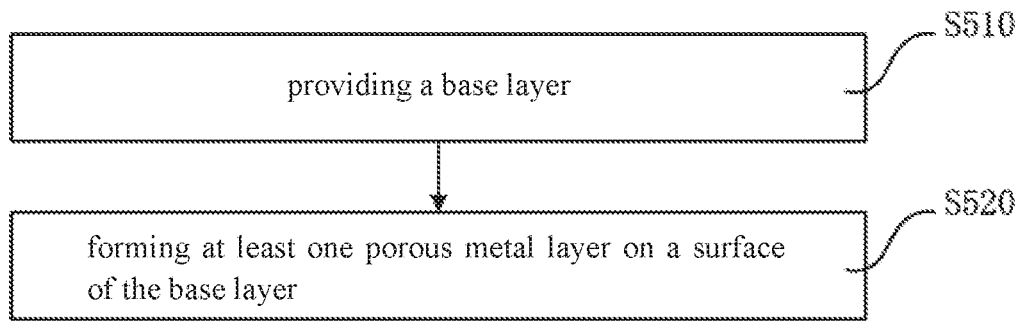
FIG. 5 is a schematic flow chart of a method of manufacturing a substrate according to an embodiment of the present invention.

Referring to FIG. 5, the present invention further provides a method for fabricating a substrate, which includes the following steps:

Step S510: providing a base layer; and

Step S520: forming at least one porous metal layer on a surface of the base layer.

In step S520, the porous metal layer can be formed by one of a liquid phase method, a solid phase method, and a metal deposition method.

In addition, in step S520, a material of the porous metal layer is a combination of one or more selected from a group consisting of copper, aluminum, iron, nickel, zinc-copper alloy, nickel-copper alloy, nickel-chromium-tungsten alloy, and nickel-iron alloy.

The invention has the advantages that the display panel can simultaneously assume the functions of protection, cushioning, and heat dissipation by adopting the emerging porous metal material, thereby simplifying the structure of the display device, reducing the overall thickness of the display device, and making the display panel simpler and thinner.

The above description is only a preferred embodiment of the present invention, and it should be noted that those skilled in the art can also make several improvements and modifications without departing from the principles of the present invention. These improvements and modifications should also be considered as the scope of protection of the present invention.

INDUSTRIAL APPLICABILITY

The subject matter of the present application can be manufactured and used in the industry with industrial applicability.

What is claimed is:

1. A substrate, comprising a base layer and at least one porous metal layer disposed on a surface of the base layer; wherein the porous metal layer is made of a mixed material comprising foamed copper or foamed aluminum alloy, wherein an energy absorption capacity of the porous metal layer ranges from 490 KJ/m3 to 3430 KJ/m3, and a heat dissipation capacity of the porous metal layer ranges from 30 W/(m·K) to 40 W/(m·K); the porous metal layer comprises a plurality of pores having directional or random properties; the porous metal layer is produced by a liquid phase method, a solid phase method or a metal deposition method.

2. A substrate, comprising a base layer and at least one porous metal layer disposed on a surface of the base layer, wherein the porous metal layer is made of a mixed material comprising foamed copper or foamed aluminum alloy, wherein an energy absorption capacity of the porous metal layer ranges from 490 KJ/m3 to 3430 KJ/m3, and a heat dissipation capacity of the porous metal layer ranges from 30 W/(m·K) to 40 W/(m·K).

3. The substrate according to claim 2, wherein the porous metal layer comprises a plurality of pores having directional or random properties.

4. The substrate according to claim 2, wherein the porous metal layer is produced by a liquid phase method, a solid phase method or a metal deposition method.

5. A display panel, comprising: the substrate of the claim 2 and a pixel array disposed on the substrate.

6. The display panel according to claim 5, wherein the porous metal layer comprises a plurality of pores having directional or random properties.

7. The display panel according to claim 5, wherein the porous metal layer is produced by a liquid phase method, a solid phase method or a metal deposition method.

* * * * *